United States Patent [19]

Hollister

[11] Patent Number: 4,791,404

[45] Date of Patent: Dec. 13, 1988

[54] PREDICTIVE TIME BASE CONTROL CIRCUIT FOR A WAVEFORM SYSTEM

[75] Inventor: Allen L. Hollister, Beaverton, Oreg.

[73] Assignee: Tektronix, Inc., Beaverton, Oreg.

[21] Appl. No.: 119,289

[22] Filed: Nov. 6, 1987

Related U.S. Application Data

[63] Continuation of Ser. No. 835,416, Mar. 3, 1986, abandoned.

[51] Int. Cl.$^4$ .............................................. H03M 1/36
[52] U.S. Cl. ................................... 341/122; 324/102; 328/151; 358/138; 331/173; 364/178; 341/155
[58] Field of Search ............... 340/347 SH, 347 AD, 340/347 M; 331/173; 358/138; 324/102, 121 R; 364/178, 179; 328/151

[56] References Cited

U.S. PATENT DOCUMENTS

| | | | |
|---|---|---|---|
| 3,398,241 | 8/1968 | Lee | 340/347 AD X |
| 3,484,591 | 12/1969 | Trimble | 364/178 X |
| 3,914,760 | 10/1975 | Logue | 340/347 AD |
| 4,050,062 | 9/1977 | Crocker et al. | 340/347 SH X |
| 4,117,409 | 9/1978 | O'Brien | 328/151 |
| 4,213,134 | 7/1980 | Chen | 328/151 X |
| 4,388,611 | 6/1983 | Haferd | 340/347 SH |
| 4,533,881 | 8/1985 | Monett | 331/173 X |
| 4,564,831 | 1/1986 | Wheable et al. | 340/347 SH X |
| 4,568,912 | 2/1986 | Kitamura et al. | 340/347 AD X |

OTHER PUBLICATIONS

Baier et al., Synchronous Digitalization of TV Images, IBM Technical Disclosure Bulletin, vol. 25, No. 2, 7/1982, pp. 639 & 640.

Millman et al., Pulse and Digital Circuits, McGraw-Hill Book Co., Inc., 1956, pp. 323-329.

Primary Examiner—T. J. Sloyan
Attorney, Agent, or Firm—John P. Dellett; Robert S. Hulse

[57] ABSTRACT

A predictive time base control circuit for a waveform sampling system of the type which converts a sequence of analog waveform samples into a sequence of digital quantities for storage in an addressable acquisition memory. The time base circuit generates a sampling control signal which initiates sampling at the end of a time interval of programmable duration following detection of a triggering event in the waveform, and which maintains sampling thereafter at regular intervals. The time base circuit permits the sampling system to operate in an equivalent time mode in which repetitive waveform sections are sampled at progressively skewed sampling intervals with respect to a repetitive triggering event. The sampling control signal is also frequency divided, delayed, and then applied as a write control signal to the sampling system acquisition memory. The time base control circuit includes a memory addressing circuit responsive to the write control signal for incrementing the address of the acquisition memory by an adjustable step size each time data is stored in the memory, thereby facilitating proper ordering of sample data in the memory.

16 Claims, 7 Drawing Sheets

PREDICTIVE TIME BASE CONTROL CIRCUIT FOR A WAVEFORM SYSTEM

This is a continuation of application Ser. No. 835,416, filed 3/3/86, now abandoned.

BACKGROUND OF THE INVENTION

The present invention relates in general to systems for sampling analog waveforms and more particularly to a method and apparatus for controlling the timing of sampling and data storage by such sampling systems.

Sampling oscilloscopes were developed more than twenty years ago to respond to small, fast-changing signals to which conventional oscilloscopes could not respond due to limited bandwidth or risetime characteristics. Sampling is a now well-known technique wherein a signal path is gated for an extremely short period of time to pass the substantially instantaneous amplitude value (voltage sample) of an electrical signal during that period. Each voltage sample taken in this manner is processed by electronic circuits and displayed as a dot on a cathode ray tube screen at an appropriate time and amplitude position. Since a large number of samples are required to reconstruct a waveform, sampling is most practical when the electrical signal is repetitive in nature since in most cases it is impossible to acquire all of the needed samples during a single event or single cycle of the signal. Indeed, one of the advantages of sampling is that at least one sample can be acquired from each of a large number of cycles, and a representative waveform may be reconstructed and displayed therefrom.

Sampling modes are typified in accordance with the timing method used. Sequential sampling is a mode in which a waveform display is comprised of an orderly series of equally spaced dots. Random sampling is a mode in which successive dots may occur at what appear to be random horizontal positions because the sampling timing and signal triggering are unrelated, although it must be pointed out that with random sampling the reconstructed waveform is defined because the sampling intervals are measured and the dots are inserted into the display at substantially correct time positions.

Random sampling systems of the prior art have been adapted for sampling a high frequency, repetitive waveform at random points along several repetitive sections of the waveform. The resulting waveform display is then formed by ordering and graphically displaying sample data according to the relative sample time of each sample with respect to a triggering event, such as a zero crossing, occurring at the same point within each waveform section. The data acquired by this "equivalent time" method of sampling characterizes the waveform with a resolution equivalent to that which would be obtained if only a single section of the waveform were sampled at a much higher sampling rate. However since the sample timing is random, more samples must be taken to obtain a minimum resolution than would be required if the sample timing were periodic.

Sequential sampling systems of the prior art do sample waveforms periodically but are not adapted for equivalent time sampling because sample timing with respect to a triggering event cannot be precisely controlled. In order for sequential sampling to be used for equivalent time sampling the sampling times for successive waveform sections would have to be progressively skewed, with respect to a repetitive triggering event occurring in each waveform section.

SUMMARY OF THE INVENTION

In accordance with one aspect of the invention, a time base circuit for a waveform sampling system is adapted to generate a periodic sampling control signal of a programmable frequency. The sampling control signal begins at the end of a time interval of programmable duration following occurrence of a triggering signal derived from a triggering event (such as a zero crossing) in the waveform being sampled, and the sampling control signal causes the sampling system to periodically sample the waveform. The sampling control signal is stopped and restarted on each occurrence of the triggering signal, with restarting being delayed for the programmable duration of the time interval. This time interval following each triggering signal may be progressively increased such that repetitive sections of a waveform are sampled at progressively delayed times relative to the triggering event occurring in each waveform section. When the delay time interval is increased by a small, regular amount after each successive waveform section is sampled, the resulting sample data characterizes the waveform with a resolution equivalent to that which could be obtained by sequentially sampling a single waveform section at a much higher sampling rate.

In accordance with another aspect of the invention, the time base circuit is adapted for use in conjunction with a sampling system, including a digitizer for digitizing analog sample data and an acquisition memory for storing the digitized sample data, wherein the time base circuit provides addressing for the acquisition memory. The memory address may be set to any initial value and then increased by a programmable amount after each waveform sample is obtained, digitized and stored in the memory. When the sampling system is operated for equivalent time sampling, the memory address may be incremented by J after each sample wherein J is the number of successive waveform sections to be sampled. After the last sample of each waveform section, the memory address is reset to a value which is incremented by one from the memory address for the first sample of the waveform. Samples taken from a plurality of repetitive waveform sections at progressively skewed sample times with respect to a periodic triggering event are therefore stored in memory in an interleaved fashion such that they are ordered according to their sampling times relative to a triggering event in each waveform section. Thus the digitizer sample data not only characterizes the waveform with the same resolution as would be obtained by sampling one section of the waveform at a higher rate, the data is also stored in memory in the proper order. This aspect of the invention enables a waveform representation based on equivalent time sampling to be easily displayed without reordering the data stored in memory.

It is accordingly an object of the invention to provide a time base circuit for generating a periodic output signal of a selectable frequency, the signal commencing at a predictable and controllable time with a respect to a triggering event.

It is another object of the invention to provide a time base circuit for a waveform digitizer which also controls digitizer acquisition memory addressing.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
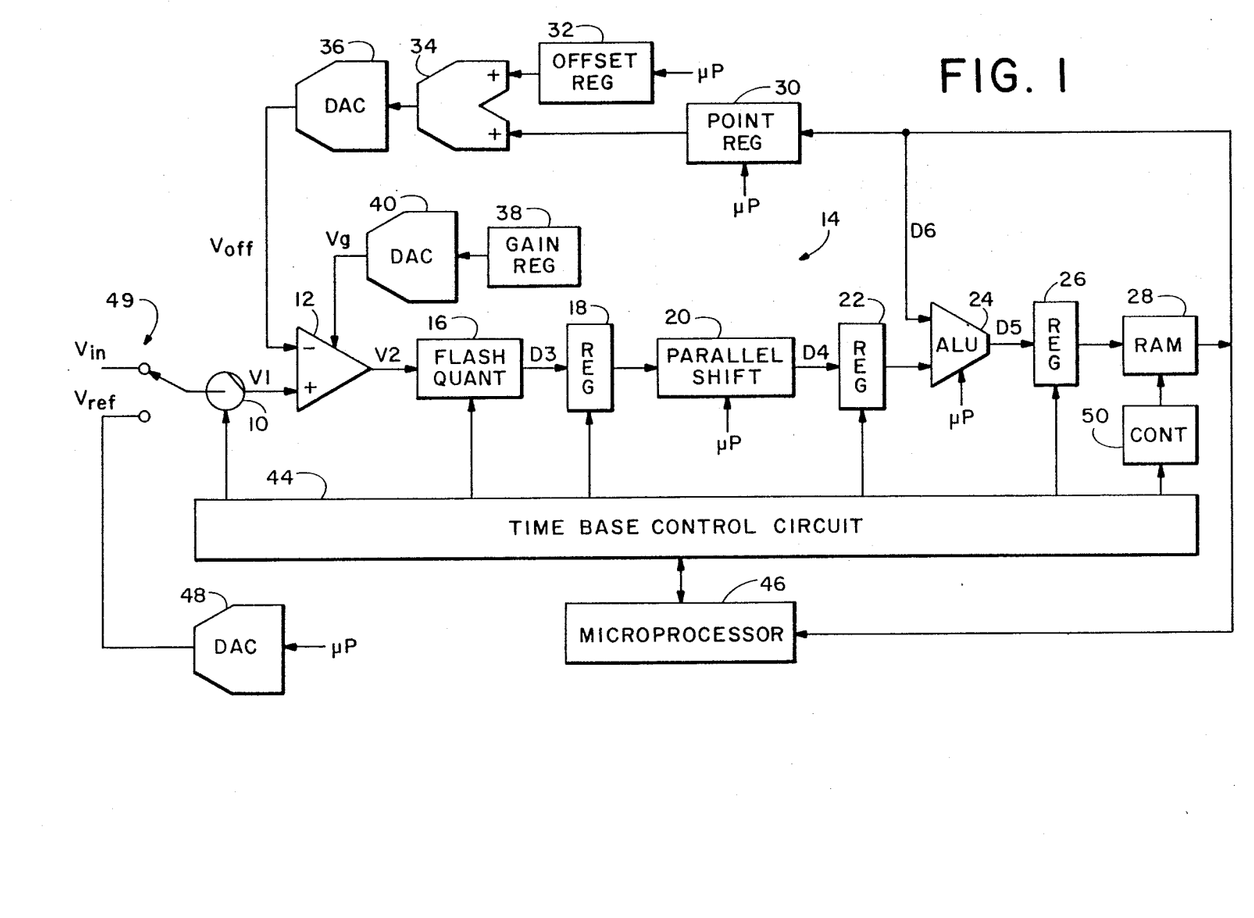
FIG. 1 is a block diagram of a waveform digitizer utilizing the present invention.

Referring to FIG. 1, there is depicted in block diagram form a waveform digitizer utilizing a time base control circuit according to the present invention. The digitizer is adapted to sample and digitize an input waveform Vin and includes a high-efficiency sampling bridge 10 capable of repetitively sampling input waveform Vin to produce a first sequence of sample output voltages V1, each voltage V1 having a magnitude substantially equal to the instantaneous magnitude of the input waveform. Each sample voltage V1 output of the sampling bridge 10 is applied to a non-inverting input of an amplifier 12, while an adjustable offset voltage Voff is applied to an inverting input of the amplifier. Amplifier 12 has an adjustable gain set according to an applied gain control voltage Vg. The output of amplifier 12 thus comprises a second sequence of voltages V2, each voltage V2 having a magnitude related to the magnitude of a corresponding voltage V1 of the first sequence by an adjustable offset and an adjustable gain. Each voltage V2 of the second sequence is applied as an input to a digital pipeline 14 comprising a flash quantizer 16, registers 18, 22 and 26, a parallel shifter 20, and an arithmetic logic unit 24. Flash quantizer 16 is an analog-to-digital converter adapted to convert the V2 voltage sequence into a third sequence of digital data D3, each data D3 comprising a 10-bit digital quantity representing the magnitude of a corresponding one of the voltages V2 of the second sequence.

Each D3 data output of flash quantizer 16 is temporarily stored in register 18 and then applied as input to parallel shifter 20 which produces an output having the same bit pattern as its input but shifted by a selected number (n) of bits such that a parallel shifter 20 input binary number is divided by a factor of $2^n$. The output of parallel shifter 20 in response to the third sequence of data D3 therefore comprises a fourth sequence of digital data D4 wherein each data D4 represents a magnitude which is an adjustable fraction of the magnitude of a corresponding data D3 of the third sequence. Each data D4 output of parallel shifter 20 is temporarily stored in register 22 and then transmitted to an input of an arithmetic logic unit (ALU) 24. ALU 24 may be set to produce a fifth sequence of data D5, each data D5 having a magnitude equal to the sum of corresponding data D4 of the fourth sequence and other data D6 applied to a second input of the ALU. The ALU 24 can also be controlled such that it does not add the second input data D6 to the data of the D4 sequence. In such case each data D5 of the fifth sequence has the same value as corresponding data D4 of the fourth sequence. Each data D5 of the fifth data sequence is temporarily stored in register 26 and then transmitted to data input terminals of a random access acquisition memory 28.

Currently addressed data stored in acquisition memory 28 is applied as the second input data D6 of ALU 24 and is also applied to an input of a "point" register 30. The contents of point register 30 and the contents of an "offset" register 32 are summed by an adder 34 and the sum is converted to a proportional analog quantity by a 16-bit digital-to-analog converter (DAC) 36. This analog quantity is then applied as the offset voltage Voff to the inverting input of amplifier 12. The gain of amplifier 12 is adjusted by modifying data stored in a gain control register 38, the contents of which are converted by a 10-bit DAC 40 into the Vg signal which controls the gain of amplifier 12.

The digitizer may be calibrated by initially setting the parallel shifter 20 for a zero (n=0) bit shift, setting ALU 26 so that it does not add data D6 to data D4, setting the data in point register 30 to zero and setting the data in offset register 32 to an arbitrary value. A zero reference voltage is then applied as the input voltage Vin to the digitizer and this zero reference voltage is sampled and digitized, the resulting digital value being stored in memory 28. If the digitized value of the reference voltage is greater than zero, the data stored in offset register 32 is increased, and if the digitized value is less than zero, the data stored in offset register 32 is decreased. This sampling and adjustment process is repeated with the data in offset register 32 being finely adjusted until the stored digitized value of the reference voltage is equal to zero.

A non-zero reference voltage is then applied as the input voltage Vin to the digitizer and the reference voltage is again sampled and digitized with the result being stored in memory 28. If the stored digital representation of the sampled reference voltage indicates a voltage higher than the reference voltage, the gain of amplifier 12 is reduced by reducing the magnitude of data stored in gain control register 38. If the stored digital representation of the sampled reference voltage indicates a voltage lower than the reference voltage, the gain of amplifier 12 is increased by increasing the magnitude of data stored in gain control register 38. The sampling and adjustment process is repeated to finely adjust the gain control data in register 38 until the digitized value of the sampled non-zero reference voltage is correct. Since the digitizer has a substantially linear response, calibration of the amplifier offset for zero input voltage and of the amplifier gain for a non-zero input voltage is sufficient for calibrating all input voltages within the linear response range of the digitizer.

The sample timing of sampling bridge 10 is controlled by a strobe signal from a time base control circuit 44 according to the present invention. Circuit 44 also controls the timing of flash quantizer 16, the input enabling of registers 18, 22, and 26 and the addressing and write enabling of memory 28. Various operating parameters of the time base control circuit 44, including strobe signal timing, the amount by which parallel shifter 20 shifts data and the operation mode (i.e., adding or not adding) of ALU 24 are determined by control signals from microprocessor 46. Microprocessor 46 also provides the offset and gain control data stored in registers 32 and 38 and controls the input enabling of registers 30, 32 and 38.

The digitizer may be operated in any of several sampling modes. In a "real time" mode of digitizer operation, the sampling bridge 10 samples the waveform Vin several times at regular intervals during one section of a Vin waveform. Each time the sampling bridge 10 samples the Vin input waveform, an analog sample V1 is transmitted to amplifier 12 which amplifies the difference between the analog sample magnitude and the magnitude of the offset signal from DAC 36, the gain of amplifier 12 being determined by data stored in gain control register 38. Flash quantizer 16 converts the resulting amplifier output V2 to digital data D3 which is then stored in register 18. Parallel shifter 20 operation is preset by microprocessor 46 such that input data from register 18 is passed to register 22 without a bit shift. The operation of ALU 24 is also set by microprocessor 46 such that ALU 24 passes the D4 data from register 22 to register 26 as data D5 without addition of data D6. The data D5 in register 26 is then stored in memory 28. The current address of memory 28 is incremented by time base control circuit 44 each time data is stored in memory 28 so that waveform data of sequence D5 is stored at successive addresses in memory 28. Since the waveform samples were acquired at regular intervals, the waveform section can be represented by plotting at regular intervals the magnitude of the data D5 in the order that it is stored in memory 28. The real time mode of operation is appropriate when the input waveform to be sampled is of a low frequency compared to the sampling rate of the system. However, for high frequency input waveforms Vin, few samples can be taken during a single waveform cycle and the digital representation will not contain enough sample points per waveform cycle to accurately reflect the shape of the waveform.

Figure 2:
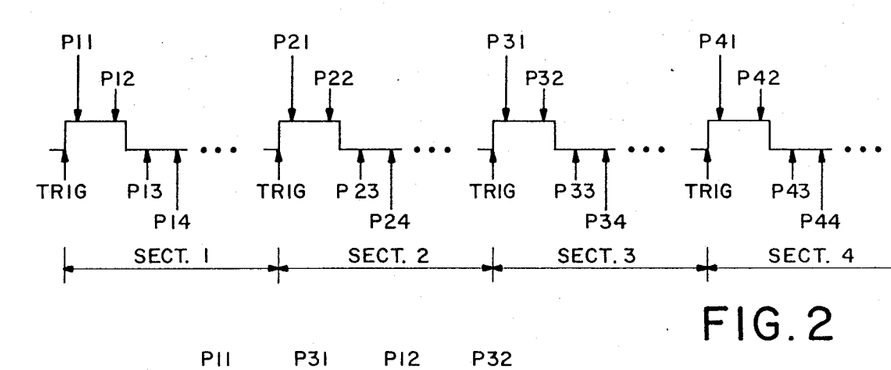
FIG. 2 is an illustration of equivalent time sampling of a waveform.

When the input waveform Vi is of a higher frequency, the digitizer may be operated in an "equivalent time" mode. In this mode, a sequence of several repetitive Vin waveform sections is sampled one or more times at regular intervals during each waveform section, the sampling times being delayed (skewed) following a similar triggering event in each successive waveform section by progressively larger amounts. FIG. 2 depicts four such waveform sections. Each waveform section includes one cycle of a high frequency square wave and the triggering event is the leading edge (zero crossing) of the square wave. The square wave signal is of such high frequency that, due to sampling rate limitations, the square wave can be sampled a maximum of only four times during each square wave cycle. The first sample P11 of cycle 1 is taken immediately following the triggering event, and the next three samples P12–P14 are taken at regular, ¼ square wave pulse width intervals during the remainder of cycle 1. The first sample P21 of cycle 2 is taken ⅛ of a pulse width after the triggering event and the remaining three samples P21–P24 are taken at ¼ pulse width intervals thereafter. In a similar fashion the four samples P31–P34 of cycle 3 are taken at ¼ of a square wave pulse width intervals starting ¼ pulse width after the triggering event and the four samples P41–P44 of cycle 4 are taken at ¼ pulse width intervals starting ⅜ of a pulse width after the triggering event.

The digitized data representing the magnitude of the waveform at P11 is stored at a starting address in memory 28 selected by data supplied to time base control circuit 44 by microprocessor 46 prior to data acquisition. The memory address is then incremented by four and the data from point P12 is stored. The digitized values representing points P13 and P14 are stored in memory at addresses incremented by eight and twelve, respectively, from the storage address of point P11. The current memory address is then decreased so that the data from point P21 is stored at the next larger memory address after the storage address of P11. The data of points P22–P24 are then stored sequentially with the memory 28 address again being incremented in steps of four. As data from samples P31–P44 are acquired, memory 28 addressing is controlled in a similar manner such that the point data is stored at successive addresses in the following order: P11, P21, P31, P41, . . . P14, P24, P34, P44. The repetitive waveform may then be graphically represented as in FIG. 3 by plotting the sample data magnitudes at regular intervals in the order in which data is stored in memory 28. The sampling interval resolution of the resulting representation is equivalent to the resolution which could be obtained in the real time mode of operation if the waveform were sampled at a rate four times faster. Therefore, given a limited maximum sampling rate, the equivalent time mode of operation permits an improvement in sampling interval resolution over that which can be obtained using the real time mode. The improvement is limited only by the smallness and accuracy of the skew increments which can be produced by the time base control circuit 44.

The digitizer may also be operated in an enhanced accuracy mode wherein the digitization accuracy and resolution may be increased beyond the 10-bit accuracy of the flash quantizer 16, for example to 12 bits or more, depending on the accuracy of other components of the digitizer. Initially, sample data is acquired, digitized to 10-bit accuracy, and stored in memory 28 using the real time or equivalent time modes described hereinabove. A subsequent section of the waveform is then sampled at similar points, but before each sample is taken, point register 30 is loaded with the sample data in memory 28 acquired at a corresponding point along a previous section of the waveform. The point data in register 30 is added to the offset data in offset register 32 by adder 34 thereby increasing the offset voltage output of DAC 36 applied to the inverting input of amplifier 12. Thus in addition to offsetting the input voltage by an amount necessary to calibrate the digitizer, the amplifier 12 further offsets the incoming sample voltage V1 by the analog equivalent of the previously acquired 10-bit data stored in memory 28 and amplifies the result. Prior to the second sampling process, the data in gain control register 38 is changed by microprocessor 46 so that the gain of amplifier 12 is increased by a factor of, for instance, 256 and parallel shifter 20 is adjusted to shift incoming data by eight bits, thereby dividing input data by 256. Also ALU 24 is set to add incoming data D4 from register 22 to the previously acquired 10-bit accurate data D6 stored in memory 28 to produce a result which more accurately reflects the magnitude of the input voltage.

The amplified difference output voltage V2 of amplifier 12 is thus quantized to 10-bit accuracy by flash quantizer 16, shifted eight bits by parallel shifter 20, and added by ALU 24 to the 10-bit data D6 previously stored in memory 28. Assuming the ALU 24 is sized to provide a 12-bit output, its 12-bit accurate output is then passed through register 26 and stored in memory 28, replacing the previously stored 10-bit accurate data. This improved accuracy method may be also utilized when calibrating the system.

When a waveform contains high frequency noise, a sampling system may sample a noise peak and the resulting picture of the waveform reconstructed from the sample data can be grossly distorted. Sampling systems of the prior art typically employ a technique called "smoothing" which distributes the effects of a noise pulse over a wider portion of the waveform representation. However, smoothing reduces the transient response of the system and a waveform reconstructed from the acquired data appears to have been distorted by a low pass filter. For instance, a square wave input would result in a representation wherein the leading and trailing edges would appear rounded. To reduce the effects of transients on the input waveform, the sampling system of FIG. 1 may be operated in one of several averaging modes wherein a repetitive waveform is sampled at similar sample points during several repetitive waveform sections. The digitized result of each sample is then divided by the number of samples taken, and the divided results for all samples are summed and stored in memory 28.

By taking a large number of samples at similar points along repeated sections of a waveform and finding the average sample value for each point, the effect of a noise spike occurring during any one sample is greatly reduced. For instance, if 1024 repetitive waveform sections are to be sampled, parallel shifter 20 is set to shift incoming data by 10 bits, thereby dividing the incoming sample data by 1024. The ALU 24 adds this divided data to data previously stored in the memory 28 location corresponding to the sample point and the data at this memory location is then replaced by the sum. After 1024 samples have been taken for each different sampling point, the resulting sum stored at each location in memory 28 comprises the average value of the 1024 samples taken at the same point within each of 1024 repetitive waveform sections. The use of averaging reduces the effects of noise and random-occurring transients on an input signal without reducing the ability of the system to accurately digitize steady-state high frequency signals.

One such averaging mode of digitizer operation, the "spin" mode, combines equivalent time sampling with hardware averaging. The input waveform is sampled only once at the same relative location with respect to the triggering event during each repetitive waveform section. The current address of memory 28 remains unchanged until, for instance, 1024 samples are acquired, divided, summed, and stored at the current memory address, thereby producing an average sample magnitude for 1024 repetitions of one sample point. The current address of memory 28 is then incremented by one and another 1024 repetitive waveform sections are each sampled once at a relative time within each waveform section with respect to a triggering event which is skewed from the sampling time of the first sample point by a selected time period. 1024 data samples for this next sample point are also divided, summed and stored at the incremented memory address. The process is continued for each successive sample point along the waveform with the sample time being shifted with respect to a triggering event after each set of 1024 samples are taken until average values have been obtained for samples at several relative times with respect to a triggering event.

The digitizer may also be operated in a "comb" mode of averaging wherein the input waveform is sampled many times at regular intervals during each of several repetitive waveform sections, rather than just once per section as in the spin mode of averaging. After each sample is taken, the incoming data for the point is digitized, divided (for instance by a factor of 1024), and then added to previously acquired data D6 stored at a current memory 28 address associated with the sampling point. The address of memory 28 is then incremented for the next sampling point. The address of memory 28 is reset to an initial address after the sample data from each sampled waveform section is digitized. The process is repeated until 1024 waveform sections have been sampled such that storage locations in memory 28 each contain the sum of 1024 digitized and divided samples representing the average value for a corresponding sampling point.

A "smooth" mode of averaging combines hardware averaging with real time sampling. The input waveform is sampled at many points during each of several successive sampling intervals along a single waveform section, the address of memory 28 being incremented only after each sampling interval. The data samples taken during each interval are divided and summed to produce a value representing an average of the data points sampled during each interval. The waveform may be reconstructed from this data with the assumption that the average values obtained represent the magnitudes of the waveform at the midpoints of the intervals.

The selection of spin, comb or smooth mode of averaging is based on the frequency of the waveform being digitized. In the comb mode of averaging the address is changed after every sample and the microprocessor must reset the memory address often. In the spin mode of averaging the microprocessor resets the memory address only after many (for example, 1024) samples are taken. Since the period of a high frequency input signal is short compared to the time required for the microprocessor to change the memory address, then for a high frequency input signal, the spin mode of averaging digitizes a waveform more rapidly than the comb mode for the same given number of samples per point. However, the comb mode is faster than the spin mode for lower frequency input signals. The smooth mode of averaging is appropriate only for digitizing very low frequency signals since all the samples are taken during only a single waveform section.

Figure 4:
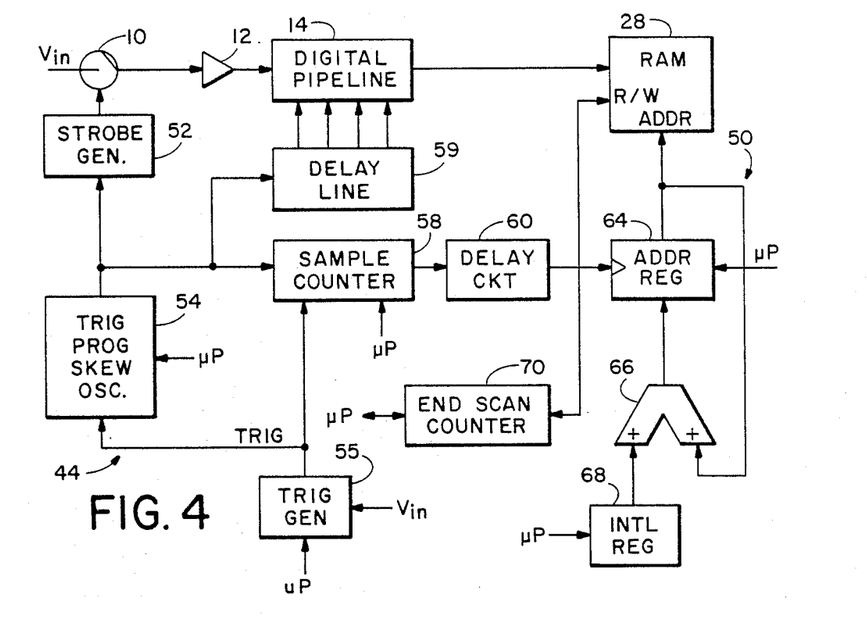
FIG. 4 is a block diagram of the time base circuit of FIG. 1 according to the preferred embodiment of the present invention.

The previously described equivalent time sampling, averaging and enhanced accuracy modes of operation require precise control over sampling times with respect to repetitive triggering events in the waveform being sampled. Such sample timing control is provided by the time base control circuit 44 of the present invention. Referring to FIG. 4, the time base control circuit 44 of FIG. 1 is depicted in more detailed block diagram form. Sampling bridge 10 of the digitizer samples the Vin input signal when it is strobed with short pulses from a strobe generator 52. Strobe generator 52 produces the strobe pulses in response to a square wave output signal from a triggered, programmable skew oscillator 54 and the frequency of the square wave output signal of oscillator 54 is determined by data from the microprocessor 46 of FIG. 1. The output signal of the oscillator is triggered by a trigger generator 55 which monitors the Vin signal and transmits a triggering signal to oscillator 54 on detection of a triggering event (such as a zero crossing) in Vin, the nature of the triggering event being defined by data from the microprocessor 46. While the output signal of oscillator 54 is initiated by the triggering signal, it is delayed following the triggering signal by a delay time interval determined according to skew data provided to oscillator 54 by the microprocessor 46. Thus the first sampling point along each repetitive waveform section of the Vi signal occurs at the end of a time interval of programmably determined duration following the triggering event. Since the oscillator 54 output signal is periodic, the waveform section is sampled periodically after the first sample is taken. The sampling control signal is stopped and restarted on each subsequent occurrence of the triggering signal, with restarting being delayed for the programmably determined time interval.

The output signal of oscillator 54 is also applied to a multiple tap delay line 59, each successive tap of the delay line providing an enabling signal to a separate device of digital pipeline 14 of FIG. 1, including flash quantizer 16, and registers 18, 22 and 26. The delay times associated with each tap are selected in accordance with the operating speed of each pipeline device to permit the data to be properly sequenced through the pipeline. The output of oscillator 54 is also applied to a sample rate counter 58 which counts the oscillator output square wave pulses and generates a write strobe pulse on occurrence of every Nth square wave pulse. The magnitude of N is set according to data provided to counter 58 by the microprocessor 46 of FIG. 1. The count of counter 58 is reset to zero by the triggering signal from trigger generator 55. Each output pulse of counter 58 is delayed by a delay circuit 60 for a sufficient time to permit the sample data to pass through the digital pipeline 14 to the data input terminals of memory 28. Each delayed counter 58 output pulse is applied to a read/write strobe input of memory 28 such that the memory is write strobed on every Nth occurrence of a sampling strobe control signal from oscillator 54. If every sample is to be stored in the memory, then the count limit N of counter 58 is set to one. But if only every Nth sample is to be stored, the count limit is set to N. The counter 58 thus enables the digitizer to sample data at a higher rate than it stores data. This feature is useful for instance when operating in the previously described enhanced accuracy mode wherein a first waveform sample is taken, digitized, and stored in memory 28 and also in point register 30 of FIG. 1 thereby increasing the offset voltage Voff when a second sample is taken at a similar point on a subsequent waveform section. Since the sample data is stepped through the digital pipeline 14 on each cycle of the strobe control signal, several cycles of the strobe control signal are required to step sample data from the sampling bridge 10 to memory 28 and since a sample is acquired on each cycle of the strobe signal, several unneeded waveform samples are acquired between the first and second samples. The count limit of counter 58 may be set such that data resulting from these unneeded samples is not stored in memory 28.

The time base circuit 44 of FIG. 4 also includes an address register 64, the contents of which address memory 28. Address data in register 64 is also applied as one input to an adder 66 while data stored in an interleave register 68 is applied as a second input to the adder. The memory write strobe signal from delay line 60 also drives a clocking input of address register 64 so that register 64 stores the output of adder 66 as the next memory address at the end of each write strobe signal. Thus the memory address may be incremented by the value of the data stored in interleave register 68 on each occurrence of a pulse from delay circuit 60. The ability to increment the memory address by a programmable amount enables the digitizer to store data in memory 28 in the right order when the digitizer is operating in an equivalent time mode, as described hereinabove, and enables the memory address to be changed rapidly after each sample without frequent intervention by microprocessor 46.

The write strobe output signals of delay circuit 60 are also applied to an end-of-scan counter 70 which transmits a signal to the microprocessor when the number of write strobes reaches a limit preset by the microprocessor. This signal tells the microprocessor that the data acquisition process is complete. Since trigger generator 55 may be enabled or disabled by a signal from microprocessor 46, the microprocessor can enable the trigger generator so that it generates one trigger signal and then disables it until the end-of-scan counter 70 indicates a predetermined number of samples have been acquired. At this point the microprocessor can enable the trigger signal again. This feature permits the microprocessor to control the number of samples per repetitive waveform section.

Figure 5:
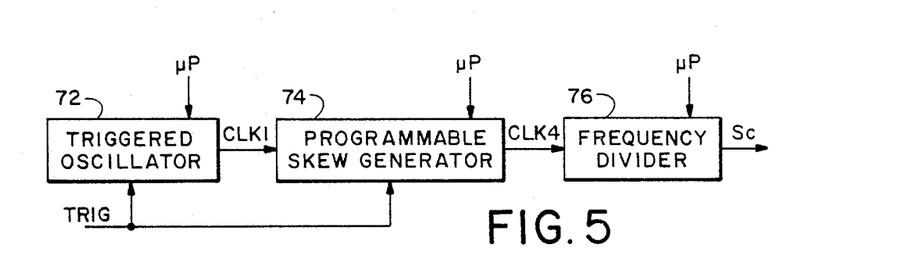
FIG. 5 is a block diagram of the programmable skew triggered oscillator of FIG. 4.

The block components of the time base control circuit 44 (other than the oscillator circuit 54) are common devices, well known in the art, and are not further detailed herein. Referring to FIG. 5, the oscillator circuit 54, depicted in more detailed block diagram form, includes a triggered oscillator 72, a programmable skew generator 74, and a programmable frequency divider 76. The triggering signal from trigger generator 55 of FIG. 4 is applied to oscillator 72 which initiates a 100 MHz square wave output signal CLK1 on receipt of the triggering signal. The oscillator 72 output signal is applied to skew generator 74 which initiates a 20 MHz output signal CLK4 following receipt of the triggering signal, delayed by a delay time determined by timing data provided by the microprocessor. The 20 MHz skew generator output signal provides an input to the frequency divider 76 which generates the strobe control signal input to the strobe generator 52 of FIG. 4. The frequency of the strobe control output signal is selected by frequency divider 76 which divides the 20 MHz input signal from skew generator 74 by an amount determined by data provided by the microprocessor 46 of FIG. 1. Devices capable of performing the functions of the triggered oscillator 74 and the frequency divider 76 are well known in the art and are not further detailed herein.

Figures 3, 6:
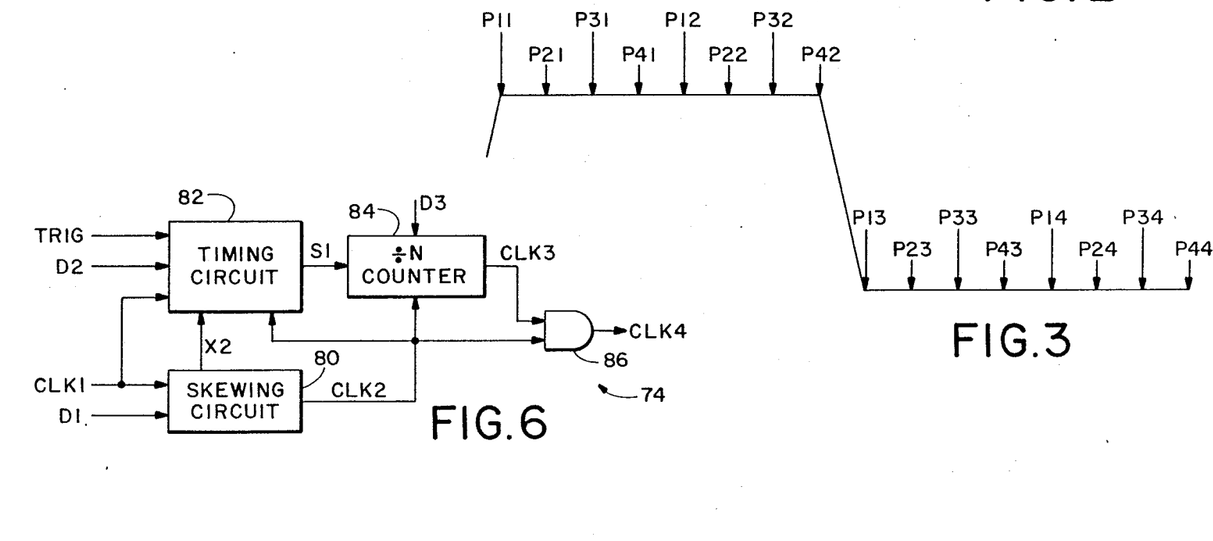
FIG. 3 is an illustration of a waveform representation produced by waveform sample data acquired according to the example of FIG. 2.
FIG. 6 is a block diagram of the programmable skew generator of FIG. 5.

Referring to FIG. 6 the programmable skew generator 74 of FIG. 5, depicted in more detailed block diagram form, comprises a skewing circuit 80, a timing circuit 82, a divide-by-N counter 84 and an AND gate 86. The skewing circuit 80 generates a square wave output signal CLK2 which is of the same frequency, 100

MHz, as the output signal (CLK1) of the triggered oscillator 72 of FIG. 5 applied as a reference clock to the skewing circuit. While CLK1 and CLK2 are of the same frequency, the skewing circuit output signal CLK2 lags CLK1 by a phase angle ranging from 0 to 360 degrees as determined by applied phase angle data D1 from the microprocessor 46 of FIG. 1.

The reference signal CLK1 also comprises an input to timing circuit 82 along with the CLK2 signal and the triggering signal TRIG which initiates the reference clock signal CLK1 and which therefore coincides with the leading edge of the first pulse of the CLK1 signal. Timing circuit 82 produces an enabling signal S1 on the leading edge of the first CLK2 pulse occurring after the end of a predetermined time interval following the triggering signal. The duration of this time interval is determined according to timing data D2 applied as input to the timing circuit 82 from the microprocessor 46 of FIG. 1 and according to the state of a binary control signal X2 produced by the skewing circuit 80. Data D2 indicates a time ($J \times T$) in terms of an integer number J of reference clock CLK1 cycles of period T, T being 10 nsec for a 100 MHz CLK1 signal. The state of the binary control signal X2 is determined according to the magnitude of the phase shift between CLK1 and CLK2. Timing circuit 82 adjusts the time interval for delaying S1 either to $J \times T$ seconds or to $(J \times T) + (T/2)$ seconds, the additional $T/2$ seconds being included in the interval if the X2 signal indicates that the phase shift between CLK1 and CLK2 is to exceed 180 degrees.

The enabling signal S1 count enables the divide-by-N counter 84 which counts pulses of the clock signal CLK2 from the skewing circuit 80. Counter 84 produces an output pulse of duration T seconds when count enabled and thereafter produces an additional output pulse each time it counts N subsequent pulses of clock signal CLK2, where N is determined according to control data D3 from microprocessor 46. In this application, where the clock signal CLK2 has a 100 MHz frequency and a 20 MHz skew generator output signal is required, N is set to 5 such that the frequency of the output signal CLK3 produced by the divide-by-N counter 84 is 20 MHz. The signals CLK2 and CLK3 are applied as inputs to the AND gate 86 which produces the 20 MHz output clock signal CLK4 of the skew generator.

Figure 7:
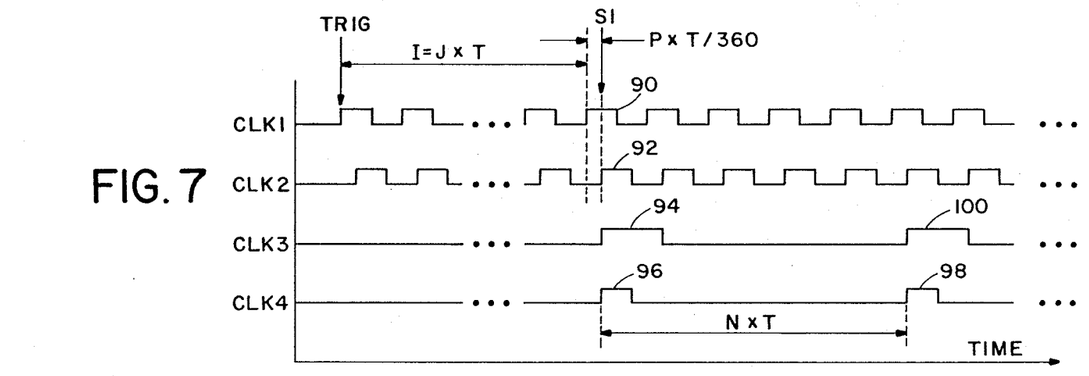
FIGS. 7 and 8 are timing diagrams showing timing relationships between signals of the circuit of FIG. 6.

The timing relationships between CLK1, CLK2, CLK3 and CLK4 when the phase shift P between CLK1 and CLK2 is less than 180 degrees are illustrated in the timing diagram of FIG. 7. When the phase shift P between CLK1 and CLK2 is less than 180 degrees, the X2 is of a state wherein the additional T/2 seconds are not included in the time interval I following the triggering signal TRIG. Since the enabling signal S1 occurs on the leading edge of first CLK2 pulse (pulse 92) after the end of interval I, the time interval between TRIG and S1 is therefore $J \times T$ seconds plus an additional amount of time ($P \times T/360$ seconds) due to the phase difference between the leading edge of the Jth CLK1 pulse 90 and the corresponding CLK2 pulse 92. CLK2 pulse 92 causes the divide-by-N circuit to initiate the first CLK3 pulse 94. The AND gate 86 of FIG. 6 then combines this CLK2 pulse 92 and first CLK3 pulse 94 to produce the first CLK4 pulse 96. The next CLK4 pulse 98 is produced N cycles of the CLK2 signal later, coincident with the next CLK3 pulse 100. Thus the first CLK4 pulse 96 occurs $(J \times T) + (P \times T/360)$ seconds after the triggering signal TRIG and subsequent CLK4 pulses occur every $N \times T$ seconds thereafter.

Figure 8:
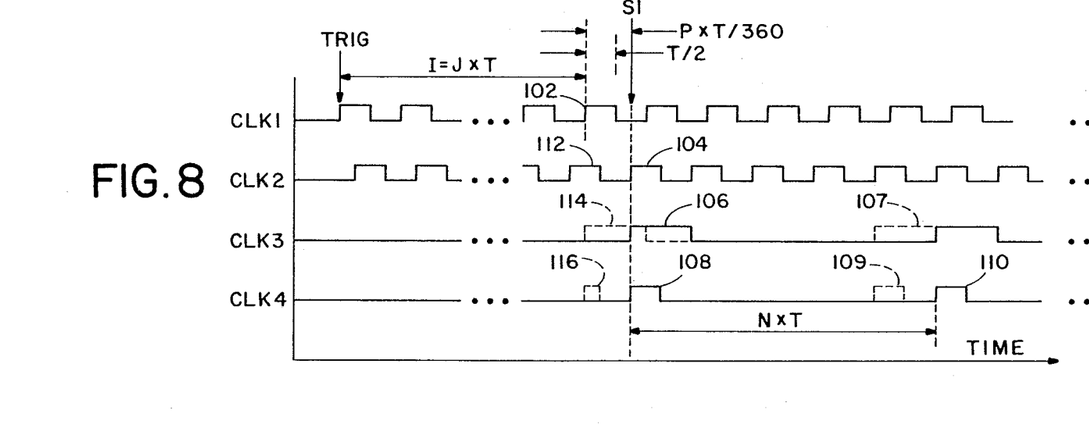

The timing relationships between CLK1, CLK2, CLK3 and CLK4 when the phase shift P between CLK1 and CLK2 is greater than 180 degrees are illustrated in the timing diagram of FIG. 8. When the phase shift P between CLK1 and CLK2 is greater than 180 degrees, the state of signal X2 is set such that the time interval I following the triggering signal TRIG is set to $(T \times J) + (T/2)$ seconds. The enabling signal S1 occurs on the leading edge of the next CLK2 pulse 104, or $(P \times T/360) - (T/2)$ seconds after the end of interval I. This CLK2 pulse 104 causes the divide-by-N circuit to initiate the first CLK3 pulse 106 which AND gate combines with CLK2 pulse 104 to form the first CLK4 pulse 108. The next CLK4 pulse 110 is produced $N \times T$ seconds later. Thus, as in the case when P is less than 180 degrees, the first CLK4 pulse 108 occurs $J \times T + P \times T/360$ seconds after the triggering signal T and subsequent CLK4 pulses occur every $N \times T$ seconds thereafter. The extra half cycle is introduced into interval I when the phase angle between CLK1 and CLK2 is greater than 180 degrees because without the extra half cycle delay, the CLK2 pulse 112 preceding pulse 104 would prematurely trigger a CLK3 pulse 114 (shown in dotted line) which would in turn cause the AND gate to prematurely produce a CLK4 pulse 116 (also shown in dotted line). Also, subsequent CLK3 and CLK4 clock pulses 107 and 109 (shown in dotted line) would occur prematurely.

From FIGS. 7 and 8 it can be seen that regardless of the magnitude of the phase shift between CLK1 and CLK2, the time delay between the triggering signal TRIG and the first CLK4 pulse is $(J \times T) + (P \times T/360)$ seconds and the interval between each subsequent CLK4 pulse is $N \times T$ seconds. Since the magnitude of P, J and N are functions of data D1, D2 and D3 from the microprocessor 46 of FIG. 1, the timing of the first CLK4 pulse and the frequency of occurrence of each CLK4 pulse thereafter are completely predictable and controllable with an accuracy determined primarily by the ability of the skewing circuit 80 to accurately adjust the phase angle difference between CLK1 and CLK2.

Figure 9:
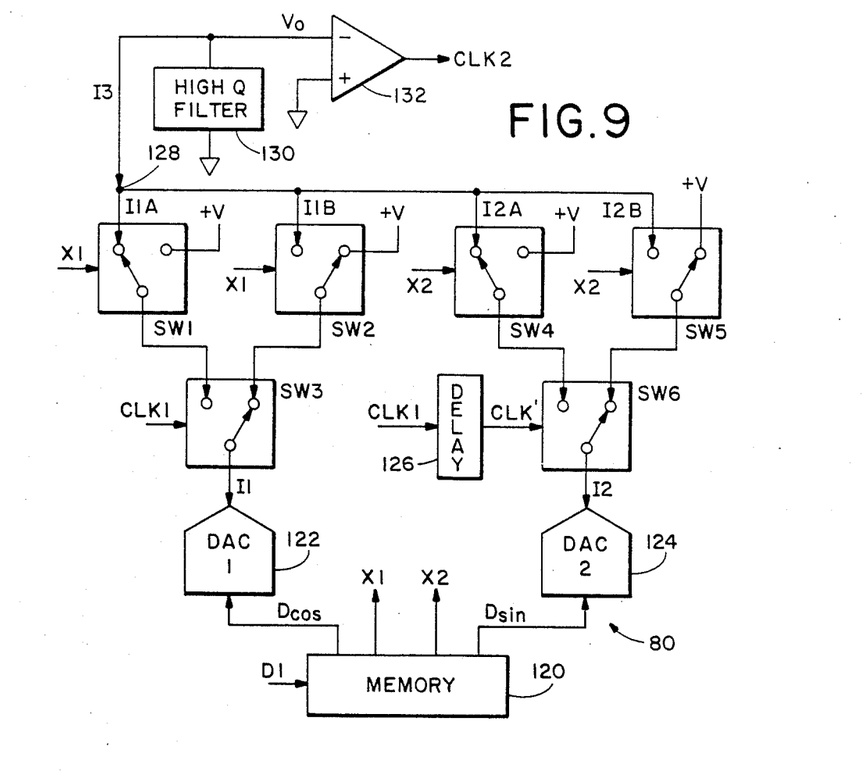
FIG. 9 is a block diagram of the skewing circuit of FIG. 6.

Referring to FIG. 9, the skewing circuit 80 of FIG. 6, depicted in block diagram form, includes a memory 120 addressed by the phase angle data D1. When D1 is set to represent a desired phase angle (from 0 to 360 degrees) between the CLK1 and CLK2 signals, memory 120 outputs data at the addressed storage location corresponding to the desired phase angle, including data D5 and D6 and binary bits X1 and X2. The magnitude of data D5 is proportional to the absolute value of the cosine of the corresponding phase angle and the magnitude of data D6 is proportional to the absolute value of the sine of the corresponding phase angle. Bits X1 and X2 comprise binary control signals which are high or low depending on the quadrant of the corresponding phase angle according to the following Table I:

TABLE I

| Quadrant | Phase Angle | X1 | X2 |
|---|---|---|---|
| First | 0 to 90 | 0 | 0 |
| Second | 90 to 180 | 1 | 0 |
| Third | 180 to 270 | 1 | 1 |
| Fourth | 270 to 360 | 0 | 1 |

It is noted that the X2 signal is high whenever the phase angle exceeds 180 degrees as required for proper operation of the timing circuit 82 of FIG. 6.

The data D5 output of memory 120 is applied as input to a first digital to analog converter 122 which acts as a constant current source, drawing a current I1 of magnitude proportional to the magnitude of D5. Data D6 is applied as the digital input to a second digital to analog converter 124 which also acts as a constant current source, drawing a current I2 of magnitude proportional to the magnitude of D6.

The skewing circuit 80 includes a set of six double pole switches SW1–SW6, suitably comprising junction transistor pairs adapted for 100 MHz switching operation. The switching states of switches SW1 and SW2 are controlled by the X1 signal produced by memory 120 and the switching states of switches SW4 and SW5 are controlled by the X2 signal. The switching state of SW3 is controlled by the reference clock signal CLK1 while the switching state of switch SW6 is controlled by an output signal CLK1' of a delay circuit 126 which produces the CLK1' signal by delaying the CLK1 signal by one quarter of a CLK1 period, or 2.5 nsec for a 100 MHz CLK1 signal. The current I1 of converter 122 is drawn from switch SW3 which in turn draws the current from switch SW2 when CLK1 is low and from SW1 when CLK1 is high. The current I2 to converter 124 is provided by switch SW6 which in turn draws current I2 from switch SW5 when CLK1' is low and from switch SW4 when CLK1' is high.

Switch SW1 draws current I1 from a node 128 (as a current I1A) when X1 is low and from a source of positive voltage +V when X1 is high, while switch SW2 draws I1 (as a current I1B) from node 128 when X1 is high and from +V when X1 is low. Similarly, switch SW4 draws I2 from node 128 (as current I1C) when X2 is low and from +V when X2 is high while switch SW5 draws I21 from node 128 (as current I1D) when X2 is high and from +V when X2 is low. A current I3 into node 128, resulting from the combination of I1A, I1B, I2A, and I2C currents from node 128 into switches SW1, SW2, SW4, and SW5, is obtained from ground through a 100 MHz, high Q filter 130. The voltage Vo developed across filter 130 as a result of current I3 is applied to an inverting input of a comparator 132 while a non-inverting input of the comparator is connected to ground.

Figure 10A:
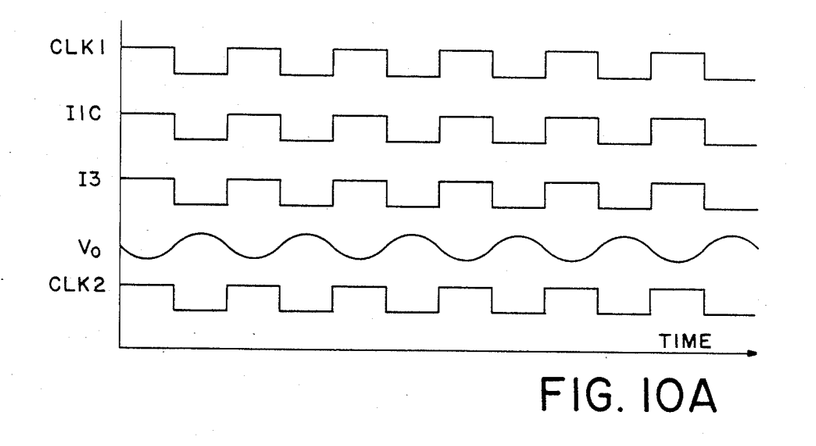
FIGS. 10A–10C are timing diagrams showing timing relationships between signals of the circuit of FIG. 9.

The operation of skewing circuit 80 is described with reference to FIG. 9 and to the timing diagrams of FIGS. 10A–10C which illustrate examples of the time varying behavior of the relevant signals of FIG. 9 when the desired phase angle between CLK1 and CLK2 is 0, 45 and 315 degrees, respectively. FIG. 10A illustrates the operation of skewing circuit 80 when the phase angle indicated by data D1 is 0 degrees. In such case X1 and X2 are both low causing switches SW1 and SW4 to draw currents I1A and I2A from node 128. The magnitude of data D5 produced by memory 120 is 1, the absolute value of the cosine of 0, and therefore the current I1 has a maximum value, for instance 100 mA. Switch SW3 draws current I1 through switch SW1 during the high state portion of each CLK1 cycle and therefore current I1A appears as a square wave in phase with CLK1. The magnitude of data D6, equal to the absolute value of the sine of zero degrees, is 0 and therefore currents I2 and I2A are zero at all times. Thus only current I1A contributes to current I3. The voltage Vo developed across filter 130 appears as a sine wave osillating about 0 potential producing a square wave comparator 132 output signal CLK2 in phase with CLK1.

Figure 10B:
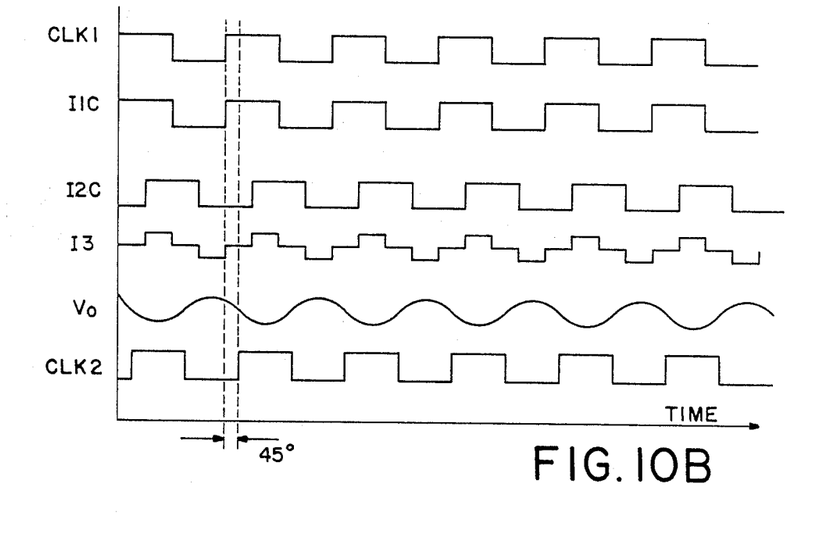

FIG. 10B illustrates the operation of skewing circuit 80 when the phase angle indicated by data D1 is 45 degrees. Again, according to Table 1, X1 and X2 are both low such that switches SW1 and SW4 draw currents I1A and I2A from node 128 but the magnitude of D5 produced by memory 120 is 0.707, the absolute value of the cosine of 45 degrees. Therefore the current I1 has a magnitude of 0.707 of maximum, for instance 70.7 mA. Switch SW3 draws current I1 through switch SW1 during the high state portion of each CLK1 cycle and therefore current I1A appears as a square wave in phase with CLK1. The magnitude of D6, equal to the sine of 45 degrees, is also 0.707 of maximum. Switch SW6 draws current I2 through switch SW4 during the high state portion of each CLK1' cycle and therefore current I2A appears as a square wave lagging CLK1 by 90 degrees. Currents I1B and I1B are zero at all times. Currents I1A and I2A combine to form current I3. Current I3 and the sine wave voltage Vo developed across filter 130 resulting from current I3 are shown in FIG. 10B. Voltage Vo causes comparator 132 to produce a square wave CLK2 output which lags CLK1 by 45 degrees. When the phase angle is another value between 0 and 90 degrees, the operation of the skewing circuit is similar except that the relative values of currents I1 and I2 differ, with I2 increasing and I1 decreasing as the phase angle is increased from 0. This causes the sine wave Vo to shift to the right as the phase angle indicated by D3 increases, thereby increasing the phase angle between the leading edges of CLK1 and CLK2 pulses in proportion to the phase angle data D1.

Figure 10C:
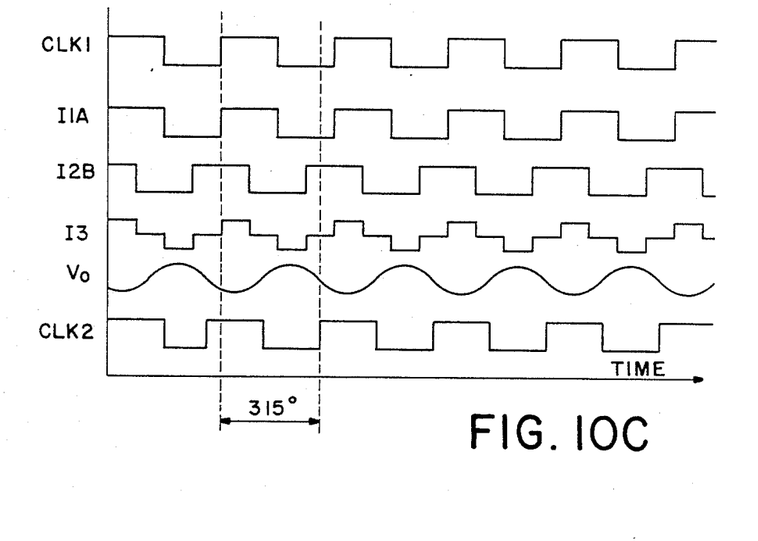

FIG. 10C illustrates the operation of skewing circuit 80 when the phase angle set by data D1 is 315 degrees. According to Table I, X1 is low and X2 is high such that switches SW1 and SW5 draw currents I1A and I2B from node 128. The magnitude of D5 produced by memory 120 is 0.707, i.e., the absolute value of the cosine of 315 degrees, and therefore the current I1 has a magnitude of 0.707 of maximum. Switch SW3 draws current I1 through switch SW1 during the high state portion of each CLK1 cycle and therefore current I1A appears as a square wave in phase with CLK1. The magnitude of D6, equal to the absolute value of the sine of 315 degrees, is also 0.707 of maximum. Switch SW6 draws current I2 through switch SW5 during the low state portion of each CLK1' cycle and therefore current I2B appears as a square wave lagging CLK1 by 270 degrees. Currents I1B and I2A are zero at all times. Currents I1A and I2B combine to form current I3. Current I3 and the sine wave voltage Vo developed across comparator 132 resulting from current I3 are shown in FIG. 10C. The voltage Vo causes comparator 132 to produce a square wave CLK2 output which lags CLK1 by 315 degrees.

Thus the skewing circuit 80 permits the phase difference between CLK1 and CLK2 to be adjusted from 0 to 360 degrees. The resolution of the adjustment depends on the resolution of digital to analog converters 122 and 124 and on the size of data D5 and D6 which can be stored in memory 120.

Figure 11:
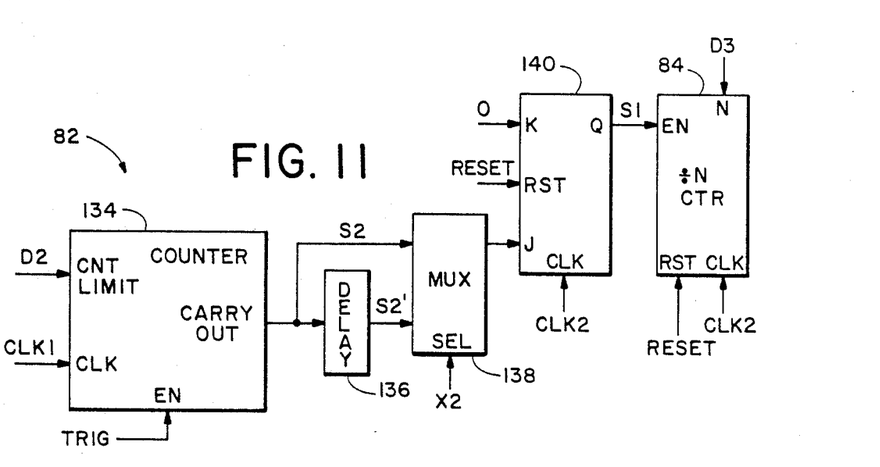
FIG. 11 is a block diagram of the timing circuit 82 of FIG. 6.

Referring to FIG. 11, the timing circuit 82 of FIG. 6, depicted in more detailed block diagram form, comprises a pulse counter 134, a delay circuit 136, a multiplexer 138, and a J-K flip-flop 140. Counter 134 counts pulses of the CLK1 signal applied to a clock input and produces an output signal S2 when the clock pulse count reaches a count limit determined by data D2 applied to a count limit input of counter 134. The counter 134 is enabled by the TRIG signal. The S2 signal is directly applied to one input of the multiplexer 138 and is indirectly applied to another input of the multiplexer through a delay circuit 136 which delays signal S1 by one fourth of a CLK1 period, or 2.5 nsec for a 100 MHz CLK1 signal. The switching state of multiplexer 138 is controlled by the X2 signal from skewing circuit 80 of FIG. 6 and the output of multiplexer 138, either S2 (when X2 is low) or the output S2' of delay circuit 136 (when X2 is high), drives the J input of flip-flop 140. A logic level 0 drives the K input of flip-flop 140 while the CLK2 signal drives the clock input of the flip-flop. The S1 enabling signal is developed at the Q output of the flip-flop and this signal input enables the divide-by-N counter 84.

After the TRIG signal enables counter 134, the counter begins counting CLK1 pulses until the count limit J determined by data D2 is reached. At this point the counter produces the S2 signal, which is passed either directly or in delayed form S2' to the J input of flip-flop 140 via multiplexer 138, so that flip-flop 140 sets on the next CLK2 pulse to produce the S1 enabling signal at its Q output. When signal generation by the skewing circuit is terminated, the flip-flop 140 and divide-by-N counter 84 are reset by a reset signal from the microprocessor.

The time base control circuit 44 of the present invention as depicted in FIG. 4 thus permits equivalent time sampling, averaging and enhanced modes of operation of the digitizer by accurately controlling the sampling rates, timing of each sample on the waveform with respect to a triggering event, the frequency at which sample data is stored in the acquisition memory, and the memory address at which each data point is stored. Microprocessor 46 controls the sample rate by adjusting the output frequency of oscillator 54 of FIG. 4 and controls the location of the sampling points on the waveform with respect to the triggering signal by adjusting the skew amount of oscillator 54. Microprocessor 46 controls the data storage rate of memory 28 by adjusting the count limit (N) of sample rate counter 58 and controls the addressing steps at which successive data is stored in acquisition memory 28 by adjusting the magnitude of the data stored in interleave register 68. The microprocessor may also directly set the memory address at any time by loading data directly into address register 64 and the microprocessor can control the total number of sample points to be stored following each triggering signal by appropriately programming the end-of-scan counter and controlling trigger generator 55.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method for controlling the timing of waveform sampling and data storage by a waveform sampling system of the type which samples an input waveform, converts a waveform sample into representative digital data, and stores the representative digital data in an addressable memory, the method comprising the steps of:

generating a triggering signal in response to a triggering event in the input waveform to be sampled;

generating a first periodic clock signal of constant frequency commencing upon generation of said triggering signal;

generating a periodic sampling control signal in response to said first periodic clock signal, said periodic sampling control signal being delayed from said first periodic clock signal by an adjustable delay time;

producing a periodic write control signal in delayed response to said periodic sampling control signal;

applying said periodic write control signal to said addressable memory for controlling timing of storage by said addressable memory of digital data representative of waveform samples produced by said waveform sampling system in response to said periodic sampling control signal; and providing address data for addressing said addressable memory, said address data being incremented by an incrementing amount in response to each period of said periodic write control signal wherein the step of generating said periodic sampling control signal comprises the steps of:

generating a second periodic clock signal having a frequency equal to that of said first periodic clock signal, said second periodic clock signal being phase skewed from said first periodic clock signal by an adjustable phase angle;

generating an enabling signal after said time interval, said time interval being determined by counting periods of said first periodic clock signal following said triggering signal;

generating a third periodic clock signal following generation of said enabling signal by frequency dividing said second periodic clock signal; and combining said second and third periodic clock signals to form said periodic sampling control signal.

2. The method according to claim 1 wherein the step of producing said periodic write control signal comprises the steps of:

frequency dividing the periodic sampling control signal; and delaying the frequency divided periodic sampling control signal.

3. A time base control circuit for a waveform sampling system of the type which samples an input waveform, converts a waveform sample into representative digital data, and stores the representative digital data in an addressable memory, wherein timing of waveform sampling is controlled by a periodic sampling control signal, the time base control circuit comprising:

a trigger generator for generating a triggering signal in response to a triggering event in the input waveform to be sampled;

a triggered oscillator responsive to said triggering signal for generating a first periodic clock signal of constant frequency commencing upon generation of said triggering signal; and means responsive to said first periodic clock signal for generating said periodic sampling control signal, said periodic sampling control signal being delayed from said first periodic clock signal by an adjustable delay time wherein said means for generating said periodic sampling control signal comprises:

a skewing circuit responsive to said first periodic clock signal for generating a second periodic clock signal having a frequency equal to that of said first periodic clock signal, said second periodic clock signal being phase skewed from said first periodic clock signal by an adjustable phase angle;

a timing circuit responsive to said first periodic clock signal and said triggering signal for generating an enabling signal after an adjustable time interval, said timing circuit measuring said time interval by counting periods of said first periodic clock signal following said triggering signal;

a first frequency divider responsive to said enabling signal for dividing said second periodic clock signal frequency by a predetermined amount following generation of said enabling signal thereby to produce a third periodic clock signal; and logic gate means for combining said second and third periodic clock signals to form said periodic sampling control signal.

4. A time base control circuit according to claim 3 further comprising first means for producing a periodic write control signal in delayed response to said periodic sampling control signal, said periodic write control signal being applied to said addressable memory for controlling timing of storage by said addressable memory of digital data representative of waveform samples produced by said waveform sampling system in response to said periodic sampling control signal.

5. A time base control circuit according to claim 4 wherein said first means comprises:
  a second frequency divider; and
  signal delaying means, said frequency divider and signal delaying means frequency dividing and delaying said periodic sampling control signal thereby to produce said periodic write control signal.

6. A time base control circuit according to claim 5 wherein said second frequency divider comprises a divide-by-N counter for producing one periodic write control signal period for every N periods of said periodic sampling control signal, where N is an integer determined by applied digital data.

7. A time base control circuit according to claim 5 further comprising memory addressing means responsive to said periodic write control signal for providing address data for addressing said addressable memory, said address data being incremented by an incrementing amount in response to each period of said periodic write control signal.

8. A time base control circuit according to claim 7 wherein said memory addressing means comprises:
  second means for storing input data in response to each period of said periodic write control signal and for providing stored input data as said address data for addressing said addressable memory; and
  third means for incrementing said address data provided by said second means by said incrementing amount thereby to produce said input data applied to said second means.

9. A time base control circuit for a waveform sampling system of the type which samples an input waveform, converts a waveform sample into representative digital data, and stores the representative digital data in an addressable memory, wherein timing of waveform sampling is controlled by a periodic sampling control signal and wherein timing of storage of said representative digital data is controlled by a write control signal applied to said memory, the time base control circuit comprising:

a trigger generator for generating a triggering signal in response to a triggering event in the input waveform to be sampled;

a triggered oscillator responsive to said triggering signal for generating a first periodic clock signal of constant frequency commencing upon generation of said triggering signal;

means responsive to said first periodic clock signal for generating said periodic sampling control signal, said periodic sampling control signal being delayed from said first periodic clock signal by an adjustable delay time:

first means for producing a periodic write control signal in delayed response to said periodic sampling control signal, said periodic write control signal being applied to said addressable memory for controlling timing of storage by said addressable memory of digital data representative of waveform samples produced by said waveform sampling system in response to said periodic sampling control signal; and memory addressing means responsive to said periodic write control signal for providing address data for addressing said addressable memory, said address data being incremented by an incrementing amount in response to each period of said periodic write control signal wherein said means for generating said periodic sampling control signal comprises:

a skewing circuit responsive to said first periodic clock signal for generating a second periodic clock signal having a frequency equal to that of said first periodic clock signal, said second periodic clock signal being phase skewed from said first periodic clock signal by an adjustable phase angle;

a timing circuit responsive to said first periodic clock signal and said triggering signal for generating an enabling signal after an adjustable time interval, said timing circuit measuring said time interval by counting periods of said first periodic clock signal following said triggering signal;

a first frequency divider responsive to said enabling signal for dividing said second periodic clock signal frequency by a predetermined amount following generation of said enabling signal thereby to produce a third periodic clock signal; and logic gate means for combining said second and third periodic clock signals to form said periodic sampling control signal.

10. A time base control circuit according to claim 9 wherein said first means comprises:
  a second frequency divider; and
  signal delaying means, said frequency divider and signal delaying means frequency dividing and delaying said periodic sampling control signal thereby to produce said periodic write control signal.

11. A time base control circuit according to claim 10 wherein said second frequency divider comprises a divide-by-N counter for producing one periodic write control signal period for every N periods of said periodic sampling control signal, where N is an integer determined by applied digital data.

12. A method for controlling the timing of waveform sampling by a waveform sampling system of the type which samples an input waveform, converts a waveform sample into representative digital data, and stores the representative digital data in an addressable memory, the method comprising the steps of:

generating a triggering signal in response to a triggering event in the input waveform to be sampled;

generating a first periodic clock signal of constant frequency commencing upon generation of said triggering signal; and generating a periodic sampling control signal in response to said first periodic clock signal, said periodic sampling control signal being delayed from said first periodic clock signal by an adjustable delay time and applied to said waveform sampling system for periodically initiating waveform sampling wherein the step of generating said periodic sampling control signal comprises the steps of:

generating a second periodic clock signal having a frequency equal to that of said first periodic clock signal, said second periodic clock signal being phase skewed from said first periodic clock signal by an adjustable phase angle;

generating an enabling signal after an adjustable time interval, said time interval being determined by counting periods of said first periodic clock signal following said triggering signal;

generating a third periodic clock signal following generation of said enabling signal by frequency dividing said second periodic clock signal; and combining said second and third periodic clock signals to form said periodic sampling control signal.

13. The method according to claim 12 further comprising the step of:

producing a periodic write control signal in delayed response to said periodic sampling control signal; and applying said periodic write control signal to said addressable memory for controlling timing of storage by said addressable memory of digital data representative of waveform samples produced by said waveform sampling system in response to said periodic sampling control signal.

14. The method according to claim 13 wherein the step of producing said periodic write control signal comprises the steps of:

frequency dividing the periodic sampling control signal; and delaying the frequency divided periodic sampling control signal.

15. The method according to claim 14 further comprising the step of providing address data for addressing said addressable memory, said addressing data being incremented by an incrementing amount in response to each period of said periodic write control signal.

16. The method according to claim 15 wherein the step of providing address data comprises the steps of:

storing input data in a register in response to each period of said periodic write control signal;

providing the input data stored in said register as said address data for addressing said addressable memory; and incrementing said address data provided by said register by said incrementing amount thereby to produce said input data applied to said register.

* * * * *